United States Patent [19]

Murata et al.

[11] 4,270,215

[45] May 26, 1981

[54] CHANNEL INDICATOR

[75] Inventors: Toshinori Murata; Shigeo Matsuura, both of Yokohama, Japan

[73] Assignee: Hitachi, Ltd., Tokyo, Japan

[21] Appl. No.: 35,101

[22] Filed: May 1, 1979

[30] Foreign Application Priority Data

| May 10, 1978 | [JP] | Japan | 53-5421 |
| Jul. 7, 1978 | [JP] | Japan | 53-81982 |
| Sep. 18, 1978 | [JP] | Japan | 53-114242 |

[51] Int. Cl.³ .............................................. H04B 1/26
[52] U.S. Cl. ................................. 455/158; 324/78 D; 324/78 F; 331/64; 358/192.1
[58] Field of Search ............... 325/335, 452, 453, 455, 325/459, 464, 468, 469, 470, 25, 419–422, 363; 358/191–193, 192.1; 331/64; 324/78 R, 78 D, 78 F; 455/154–158

[56] References Cited

U.S. PATENT DOCUMENTS

| 3,701,951 | 10/1972 | Krausser | 325/455 |
| 3,913,020 | 10/1975 | Van Anrooy | 325/470 |
| 3,988,681 | 10/1976 | Schürmann | 325/464 |

OTHER PUBLICATIONS

"Acoustic Surface Wave Filter for T.V. Tuning CKTS"–D. C. Grice et al., Aug. 1976, IBM Technical Disclosure Bulletin, vol. 19, No. 3, pp. 971-974.

*Primary Examiner*—Marc E. Bookbinder
*Attorney, Agent, or Firm*—Craig & Antonelli

[57] ABSTRACT

A channel indicator suitable for use in a television receiver and an FM receiver each having an electronic tuner is disclosed in which a channel number now being received can be automatically indicated by counting the number of those local oscillation frequencies corresponding to respective channels which the local oscillation frequency of the electronic tuner has passed prior at the arrival to a desired value. Means for compensating for irregular frequency channel intervals and temperature variations are included.

14 Claims, 15 Drawing Figures

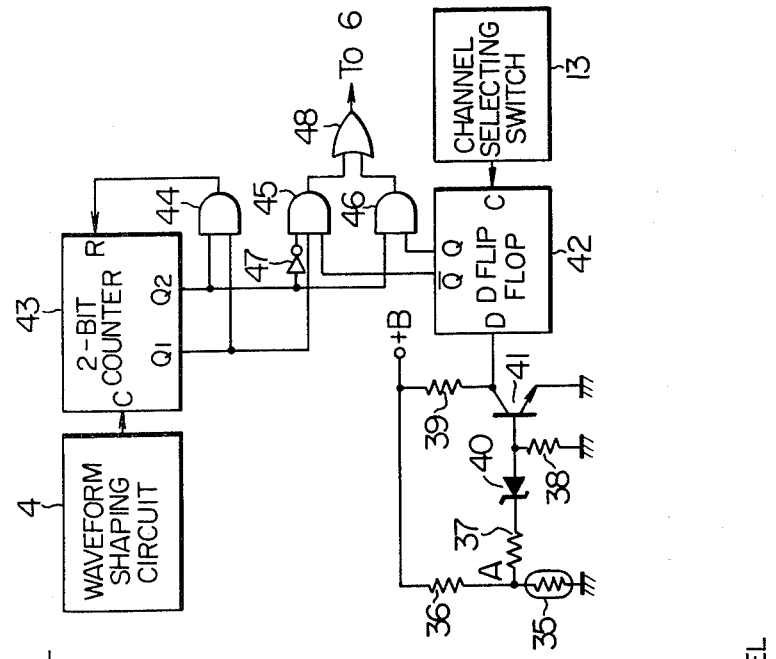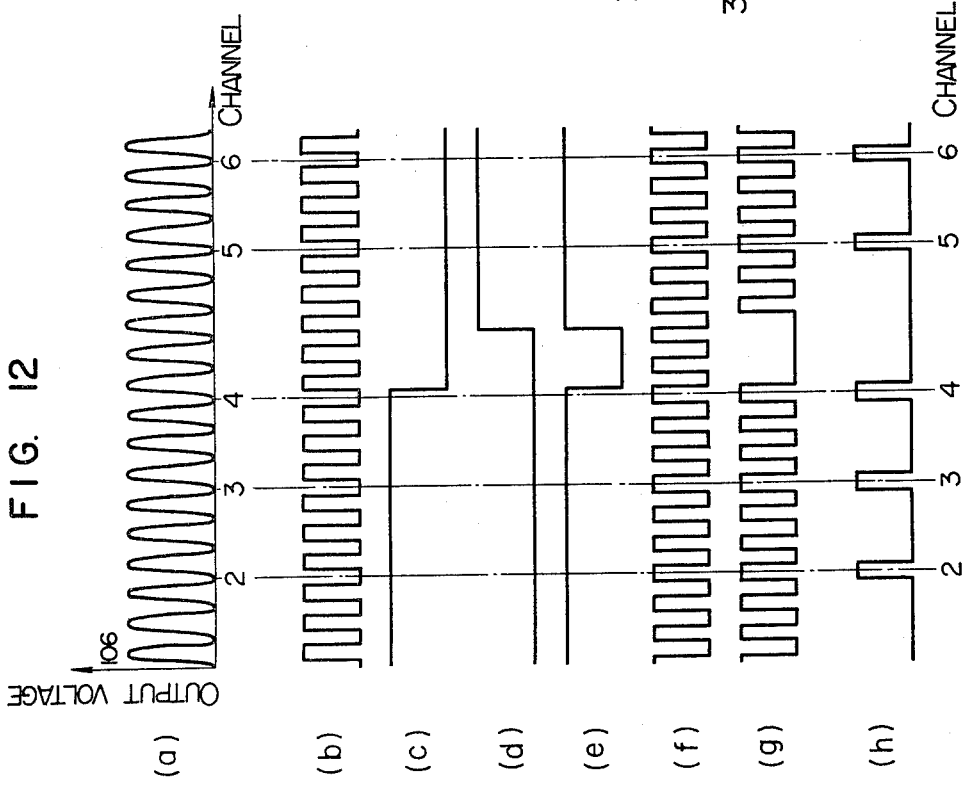

CHANNEL INDICATOR

The invention relates to a preset channel indicator having the function of indicating channel numbers and suitable for use in a television receiver and an FM receiver provided with an electronic tuner.

In a known channel selection apparatus employing an electronic tuner, a digital-analog converter (hereinafter referred to as a D-A converter) is employed. In this system, a tuning voltage for channel selection is generated by a digital code, a digital code by which an optimum tuning is obtained at a presetting time is stored in a memory device, and the stored digital code is read out in selecting the channel to generate the tuning voltage. In the system, however, the tuning voltage for receiving a specified channel varies widely depending upon electronic tuners used. As a result, the digital code stored in the memory device is not combined with the channel number in a one-to-one correspondence, and thus it is impossible to judge the channel number by the digital code. Accordingly, even if a broadcasting wave is received at a presetting time or when a desired channel is being selected, one cannot know what channel is being received unless he checks a broadcasting program table.

An object of the present invention is to provide a channel indicator which can overcome the drawbacks of the known apparatus and has a channel number indicating function such that a channel number of a channel which is being received can be automatically known.

In order to achieve the above-mentioned and other objects, in the present invention, a channel number is obtained by counting how many times a local oscillation frequency of an electronic tuner has passed local oscillation frequencies corresponding to respective channels when the local oscillation frequency is increased to a specified value. In other words, a channel indicator according to the present invention comprises an electronic tuner including therein a voltage-controlled local oscillator, a memory device for storing therein digital signals corresponding to a tuning voltage applied to the electronic tuner and a band change-over signal, means for storing thereby the digital signals in the memory device, a comb-shaped surface acoustic wave filter for receiving an output of the oscillator, a detector for detecting an output of the comb-shaped filter, a counter for counting the number of outputs derived from the detector, and a channel number indicator for indicating channel numbers based upon the outputs from the counter.

Preferred embodiments of the present invention will now be described in conjunction with the accompanying drawings, in which.

Figure 3:
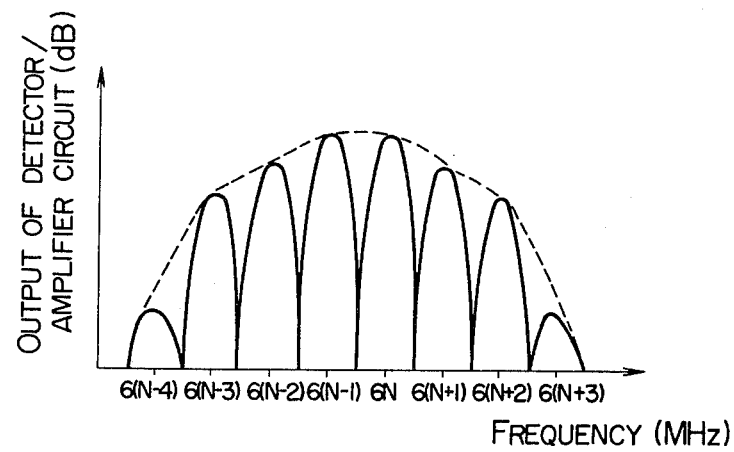
Figure 2:
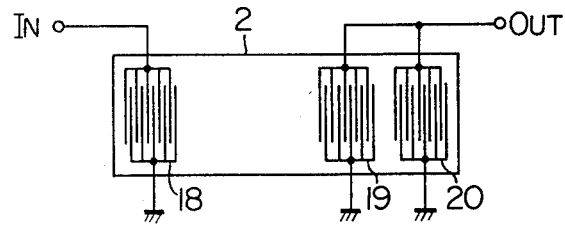
FIG. 2 is a schematic view showing a surface acoustic wave element used in the embodiment of FIG. 1.
Figure 4:
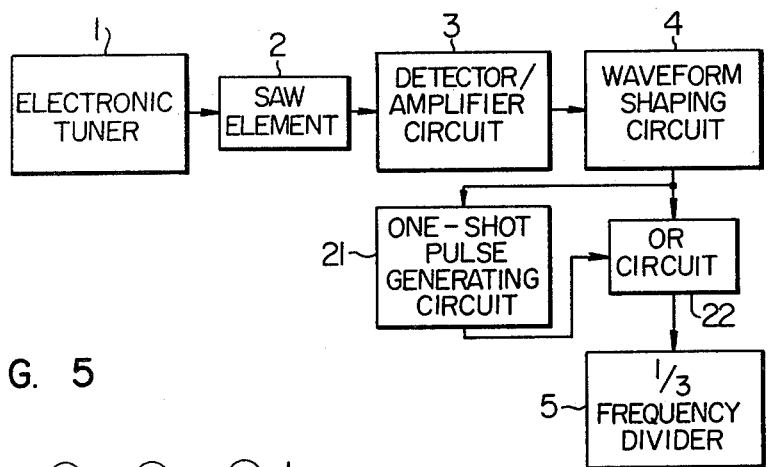
Figure 5:
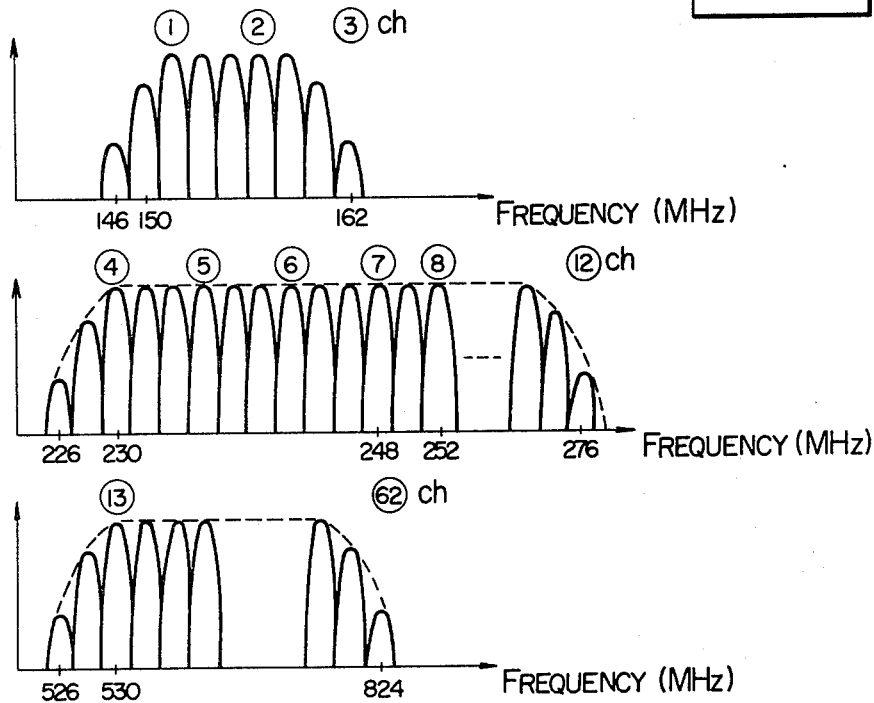
Figure 6:
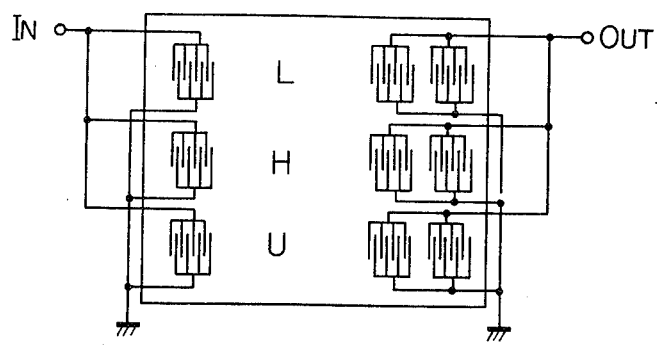
Figure 7:
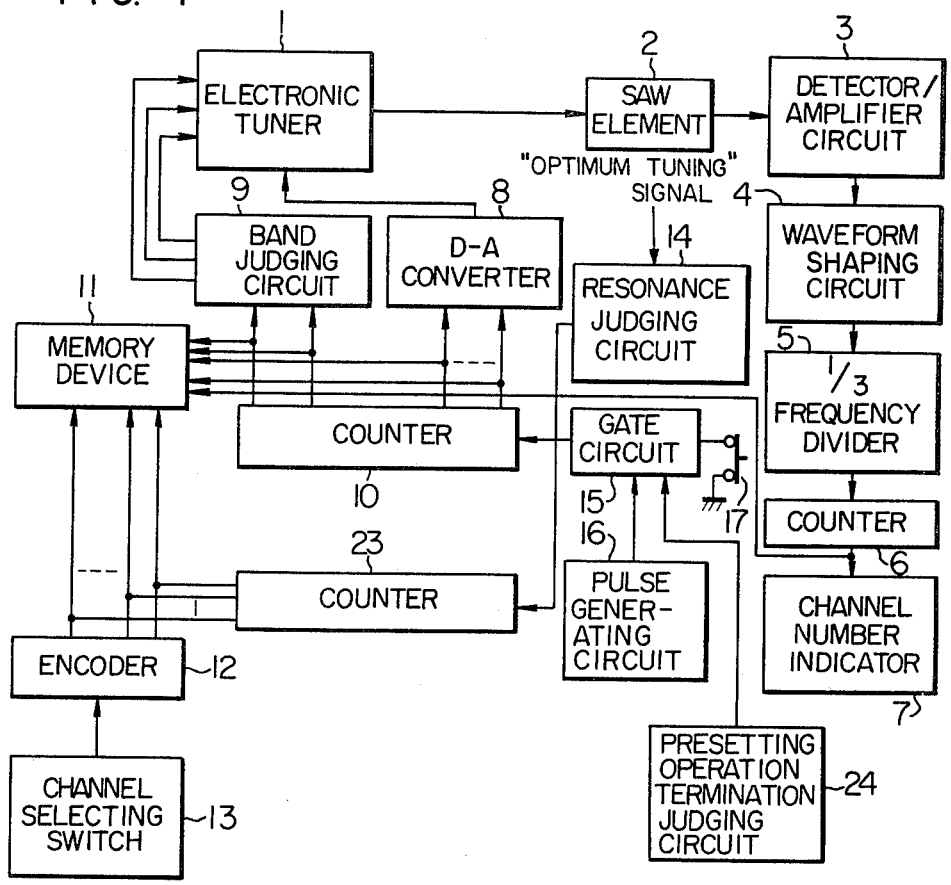
Figure 8:
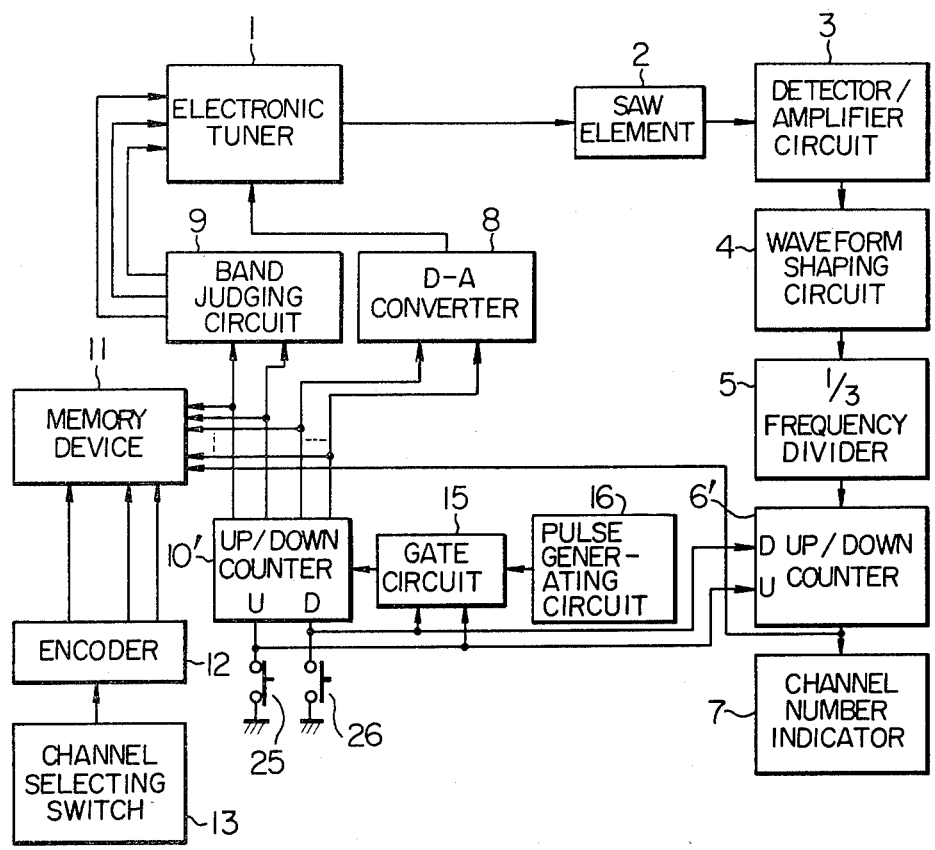
Figure 9:
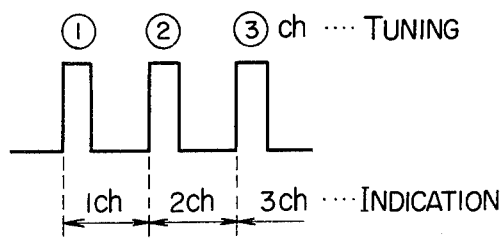
Figure 10:
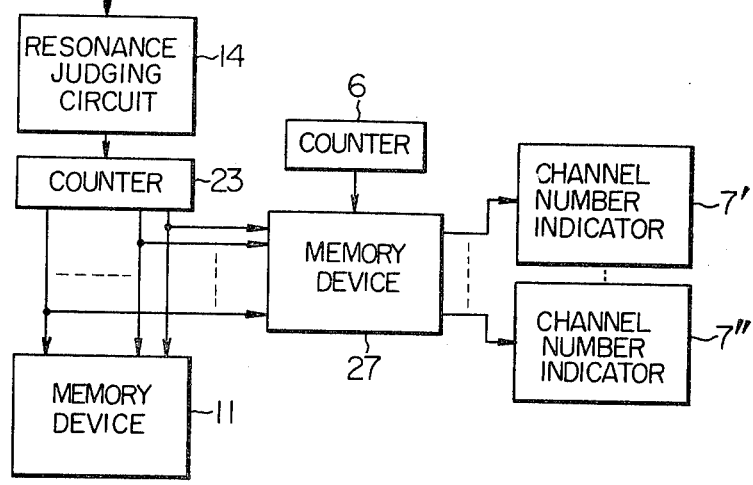
Figure 11:
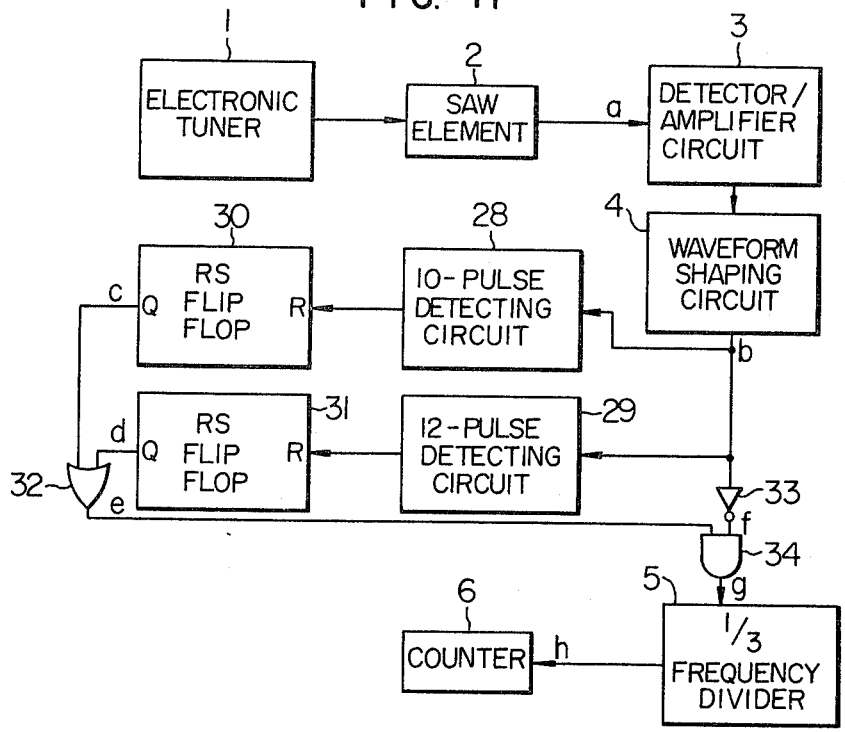
Figure 14:
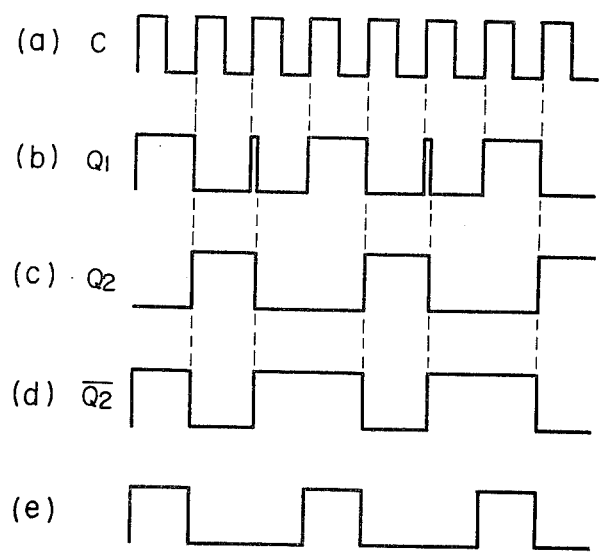
Figure 15:
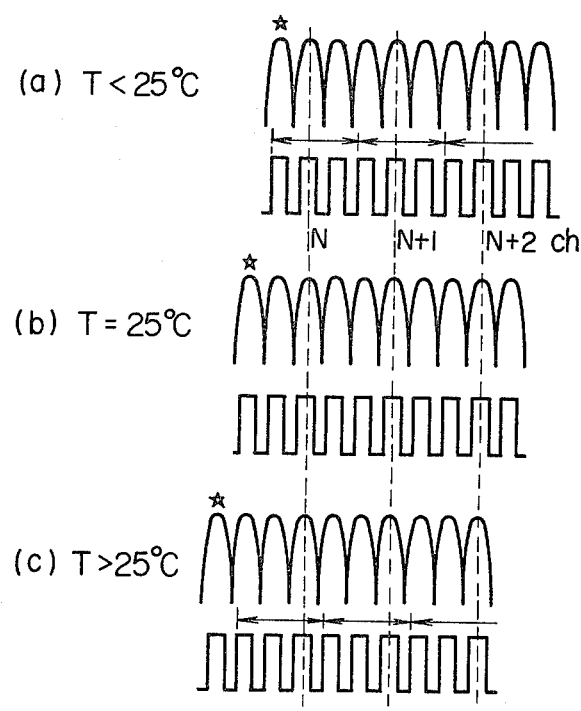

FIG. 3 graphically shows a frequency characteristic of the surface acoustic wave element shown in FIG. 2;

FIG. 4 is a block diagram for explaining an example of a method of setting a frequency-interval of a surface acoustic wave element in a VHF high band;

FIG. 5 shows frequency characteristics of those surface acoustic wave elements respectively for VHF low band, VHF high band and UHF band which are used in television receivers;

FIG. 6 is a schematic view showing an arrangements of the surface acoustic wave elements having the frequency characteristics shown in FIG. 5;

FIG. 7 is a block diagram showing a second embodiment of a channel, indicator according to the present invention;

FIG. 8 is a block diagram showing a third embodiment of a channel indicator according to the present invention;

FIG. 9 is a waveform chart for explaining an operation of the embodiment shown in FIG. 8;

FIG. 10 is a block diagram for explaining a channel number indicating process in a channel number indicating part of a channel indicator according to the present invention;

FIG. 11 is a block diagram showing a channel counter circuit used in a channel indicator according to the present invention;

FIG. 12 shows waveform charts for explaining an operation of the channel counter circuit shown in FIG. 11;

FIG. 13 is a block diagram showing a temperature compensating circuit used in a channel indicator according to the present invention;

FIG. 14 shows waveform charts of signals used in the temperature compensating circuit shown in FIG. 13; and FIG. 15 shows relations between the temperature compensating circuit and the surface acoustic wave element.

Figure 1:
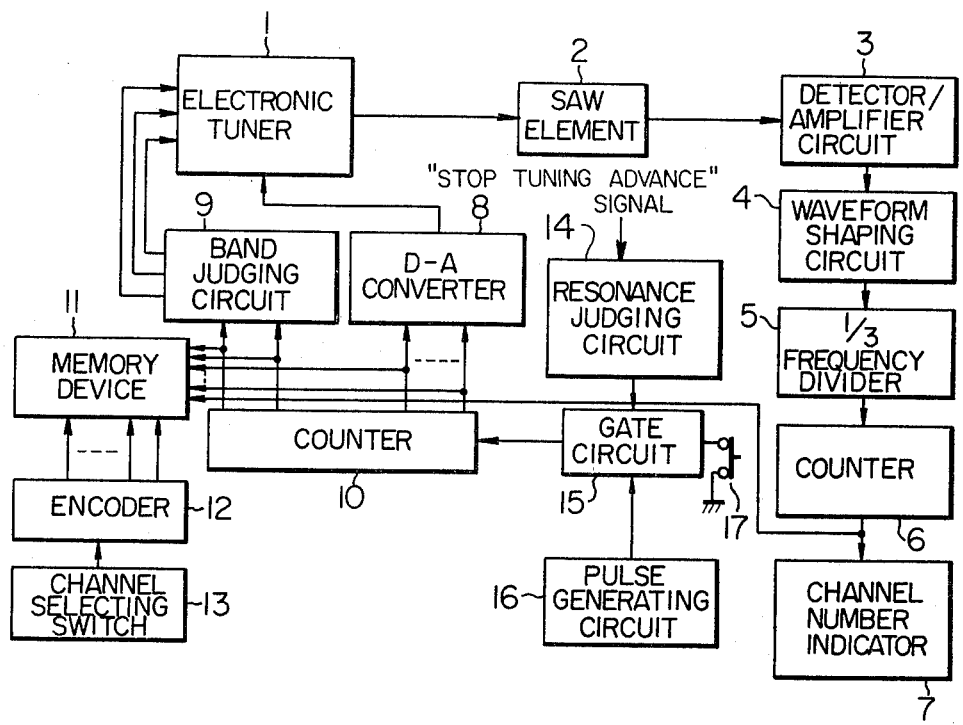
FIG. 1 is a block diagram showing a first embodiment of a channel indicator according to the present invention.

FIG. 1 shows a first embodiment of the present invention, that is, a channel indicator selection operating in a channel selection apparatus of so-called searching and presetting system. Referring to FIG. 1, reference numeral 1 indicates an electronic tuner, 2 a surface acoustic wave element (hereinafter referred to as an SAW element), 3 a detector/amplifier circuit, 4 a waveform shaping circuit, 5 a ⅓ frequency divider, 6 a counter, 7 a channel number indicator, 8 a D-A converter, 9 a band judging circuit, 10 a counter, 11 a memory device, 12 an encoder, 13 a channel selecting switch, 14 a resonance judging circuit, 15 a gate circuit, 16 a pulse generating circuit, and 17 a presetting operation starting switch. Now, the SAW element 2 will be explained below in detail. Referring to FIG. 2 showing the structure of an SAW element, reference numeral 18 indicates an input electrode, and 19 and 20 output electrodes. A local oscillation signal from the electronic tuner 1 is applied to the input electrode 18 to be converted into a surface acoustic wave, which is sent to the output electrodes 19 and 20 to be converted into electrical signals. The converted signal from the output electrode 20 has a delay time $\tau$ relative to the converted signal from the output electrode 19, since the distance between the input electrode 18 and the output electrode 20 is greater than that between the input electrode 18 and the output electrode 19. That is, if the voltage delivered from the output electrode 19 is expressed by $Ae^{j\omega t}$, the voltage from the output electrode 20 can be expressed by $Ae^{j\omega(t-\tau)}$, where $\omega = 2\pi f$, and f indicates a frequency. Since the output electrodes 19 and 20 are connected with each other, the output voltage V delivered from an output terminal of the SAW element is given by the following equation:

$$V = A(e^{j\omega t} + e^{j\omega(t-\tau)}) \qquad (1)$$

The output voltage V is amplitude-detected and amplified by the detector/amplifier circuit 3 which is connected with the output terminal of the SAW element 2. The output voltage $V_o$ taken out of the detector/amplifier circuit 3 is given by the following equation:

$$V_o = G \mid V \mid = GA \sqrt{2(1 + \cos\omega\tau)} \quad (2)$$

where G indicates an amplification degree.

As is evident from the equation (2), the output voltage $V_o$ is maximum when $f = N/\tau$, where N is an integer. Accordingly, a frequency interval $\Delta f$ between adjacent maximum values is equal to $1/\tau$.

In many cases, since the television broadcasting channels are provided at intervals of 6 MHz, the distance between the electrodes 18 and 19 and the distance between the electrodes 18 and 20 are selected to assure $\tau = 1/6$ μsec, thereby making the output voltage $V_o$ maximum at intervals of 6 MHz. Further, when the spacing between adjacent comb-tooth electrodes of the input and output electrodes 18, 19 and 20 is given by d and a propagation velocity of a surface acoustic wave is given by v, the SAW element 2 exhibits a band pass characteristic having a center frequency of v/2d. The band width is made narrow or wide according as the number of the comb-tooth electrodes is increased or decreased. FIG. 3 shows a frequency characteristic of an SAW element. When the frequency band of the SAW element 2 is so made as to correspond to that of the local oscillator, the output voltage from the detector/amplifier amplifier circuit 3 assumes a maximum value at intervals of 6 MHz, as shown in FIG. 3, and each peak shown in FIG. 3, corresponds to a channel. Therefore, by sweeping the oscillation frequency of the local oscillator and by counting the number of peaks in the output signal from the detector/amplifier circuit 3, one can know how many channels have been passed.

The present invention makes use of this principle to indicate channel numbers. There will be explained below in detail how the frequency-interval of the SAW element 2 is set in Japan, for example. In Japan, local oscillation frequencies corresponding to respective channels are included in a VHF low band of 150-162 MHz, a VHF high band of 230 to 276 MHz, and a UHF band of 530 to 824 MHz. As regards the VHF low band, local oscillation frequencies 150, 156 and 162 MHz corresponding to three channels can be divided by six. Accordingly, if an SAW element having a frequency-interval of 6 MHz is employed, the output voltage of the detector/amplifier circuit 3 assumes a maximum value at respective local oscillation frequencies corresponding to the above channels. As regards the VHF high band and the UHF band, however, local oscillation frequencies 230, 236, 242, ..., 530, 536, 542 MHz, ..., which correspond to television channels, cannot be divided by six. To overcome this problem, an SAW element having a frequency-interval of 2 MHz is employed. In this case, the detector/amplifier circuit 3 delivers peak voltages at intervals of 2 MHz, and the peak voltages are sent to the waveform shaping circuit 4, and then frequency-divided or frequency-demultiplied by the ⅓ frequency divider 5. Needless to say, the above process is also applicable for the VHF low band. Accordingly, in the case that the SAW element having a frequency-interval of 2 MHz is employed, the center frequency and band width of the SAW element 2 are so selected that the output voltage of the detector/amplifier circuit 3 is converted into pulses from 146 MHz in the VHF low band, from 226 MHz in the VHF high band, and from 526 MHz in the UHF band. The pulses thus obtained are subjected to the ⅓ frequency division. In the VHF high band, however, the frequency interval between the seventh channel and the eighth channel is 4 MHz, that is, the channel-interval is different from other channel-intervals of 6 MHz. This problem can be solved in the following manner. FIG. 4 shows a circuit arrangement for producing correct channel numbers in the VHF high band. Reference numerals 1 to 5 in FIG. 4 denote the same parts as in FIG. 1. Reference numeral 21 denotes a one-shot pulse generating circuit for generating one pulse when the number of pulses sent out of the waveform shaping circuit 4 reaches 12, and reference numeral 22 indicates an OR circuit for adding the pulses from the waveform shaping circuit 4 and the pulse from the one-shot pulse generating circuit 21.

In the VHF high band, the waveform shaping circuit 4 delivers one pulse at intervals of 2 MHz for local oscillation frequencies more than 226 MHz inclusive. Accordingly, the circuit 4 delivers a 12th pulse when the local oscillation frequency passes the seventh channel (or 248 MHz). Thus, the one-shot pulse generating circuit 21 can produce one pulse. This pulse is added to the pulse from the waveform shaping circuit 4 by the OR circuit 22 to be frequency-divided by the ⅓ frequency divider 5. Therefore, when two more pulses are delivered from the waveform shaping circuit 4, that is, when the local oscillation frequency reaches 252 MHz (corresponding to the eighth channel), the ⅓ frequency divider 5 can deliver one pulse.

FIG. 5 shows frequency characteristics of SAW elements respectively for VHF low band, for VHF high band and for UHF band, when the elements are incorporated in a television receiver. FIG. 6 shows an arrangement of the SAW elements. In FIG. 5, reference numerals enclosed with a circle denote channel numbers. The ⅓ frequency divider 5 delivers, in the form of a pulse, only a peak corresponding to each of the channels. As seen in FIG. 6, the element L for VHF low band, the element H for VHF high band and the element U for UHF band are connected in parallel and arranged on the same substrate, because these elements have a comb-shaped characteristic only in their own frequency bands.

For the channel indicator of the present invention shown in FIG. 1, the presetting, channel selecting and channel number indicating operations are described below in detail.

At a presetting time, one of buttons in the channel selecting switch 13 is selected and depressed. The switch 13 is made up of 8 to 16 buttons, and usually the first button is selected. The counters 6 and 10 are reset in advance, and thus their outputs are both made equal to zero. The lower bit portion (usually made up of 12 to 16 bits) of the counter 10 forms a digital code for the tuning voltage. When all of these bits are zero, the output of the D/A converter 8 or the tuning voltage is equal to zero volt. While, when all of the bits are 1, the tuning voltage assumes a maximum value. Further, the upper bit portion (usually including two bits) of the counter 10 forms a band code, and the band judging circuit 9 is in the states of 00, 01 and 10, so operated as to enable the reception of the VHF low band, VHF high band and UHF band, respectively. Accordingly, when the counter 10 is reset, the electronic tuner 1 is placed in a condition capable of receiving the VHF low band, and the tuning is made OV.

Next, the presetting operation starting switch 17 is depressed to turn the gate circuit 15 on, and to send the pulses produced in the pulses generating circuit 16 to the counter 10. The gate circuit 15 is maintained in the on-state, even when the switch 17 is turned off. The counting in the counter 10 starts from zero, and the count is increased with time. Thus, the output voltage of the D-A converter 8 is increased and the local oscillation frequency of the electronic tuner 1 is raised. When the local oscillation frequency reaches a frequency (for example, 150 MHz in Japan) corresponding to a first channel, that is, when a first optimum tuning is obtained, the resonance judging circuit 14 puts the gate circuit 15 in the off-state As a result, the pulses produced in the pulse generating circuit 16 are no longer sent to the counter 10. Thus, the counting in the counter 10 is stopped and the count is left unchanged or fixed. Accordingly, the electronic tuner 1 is applied with a constant tuning voltage, and the reception of the first channel is continued. As described previously, in the course as above, three voltage peaks are delivered from the detector/amplifier circuit 3 to be converted by the waveform shaping circuit 4 into three pulses, which are frequency-divided by the $\frac{1}{3}$ frequency divider 5. One pulse is sent to the counter 6, and thus 1 is counted. As a result, it is shown in the channel number indicator 7 that the first channel is now being received.

Further, at this time, there is generated in the encoder 12 a code corresponding to the selected button of the channel selecting switch 13. The code specifies an address of the memory device 11. In the address are stored a band code corresponding to the frequency band in which the received broadcasting wave is included, a code corresponding to the tuning voltage, and a channel number. In other words, the first channel is preset by the first button of the channel selecting switch 13. Similarly, a second button of the switch 13 is selected and depressed, and subsequently the presetting operation starting switch 17 is pushed. Thus, a next address of the memory device 11 is specified by the encoder 12. Simultaneously, the gate circuit 15 is again put in the on-state, and the pulses produced in the pulse generating circuit 16 are sent to the counter 10, to raise the tuning voltage again. When the tuning voltage reaches a local oscillation frequency (corresponding to a next channel, for instance, 3rd channel), the rise of the tuning voltage is stopped by the resonance judging circuit 14. In this course, six voltage peaks are further delivered from the detector/amplifier circuit 3, and the count in the counter 6 becomes 3. Accordingly, it is indicated by the channel number indicator 7 that the 3rd channel is now being received. Simultaneously with the above indication, in the memory device 11 are stored the band code, the tuning voltage code and the channel number of the 3rd channel.

When the tuning voltage is raised to make all of the bits of the lower bit portion of the counter 10 equal to 1, the tuning voltage assumes a maximum value. Thus, as soon as the counter 10 receives the next pulse from the pulse generating circuit 16, the upper bit portion of the counter 10 is put in the state of 01, and the bits of the lower bit portion are all reset to 0. Accordingly, the electronic tuner 1 is placed in the condition that the VHF high band can be received, and moreover the tuning voltage is increased from zero volt. In this manner, in the memory device 11 can be stored a band code, a tuning voltage code and a channel number of each of channels in the VHF high band and UHF band, together with the indication of the channel number by the channel number indicator 7.

In receiving a desired channel, a button of the channel selecting switch 13 which corresponds to the desired channel is selected and depressed. Thus, an address of the memory device 11 corresponding to the selected button is specified by the encoder 12. A band code, tuning voltage code, and channel number information are sent from the specified address of the memory device 11 to the band judging circuit 9, the D-A converter 8, and the channel number indicator 7, respectively.

Accordingly, the electronic tuner 1 is placed in the state that the specified band can be received and applied with the specified tuning voltage, thereby making possible the reception of the desired channel. Further, the channel number of the desired channel can be indicated by the channel number indicator 7.

In the present invention, it is not always required to store the channel number in the memory device 11. In the case that the channel number is not stored, the tuning voltage is first made equal to zero, and then is continuously increased to reach a predetermined voltage. Thus, the local oscillation frequency of the electronic tuner 1 is continuously increased, and therefore a predetermined number of voltage peaks are delivered from the detector/amplifier circuit 3. Accordingly, a desired channel number can be indicated in the same manner as the presetting operation. In this case, however, it is required to add 0, 3 and 12 to a count indicated by the counter 6 in the VHF low band, VHF high band, and UHF band, respectively.

FIG. 7 is a block diagram showing a second embodiment of the present invention. Like parts in FIG. 7 are given the same reference numerals as in FIG. 1. Referring to FIG. 7, reference numeral 23 denotes a counter, and 24 a circuit for judging the termination of the presetting operation. In the first embodiment, the tuning voltage is maintained at a fixed value each time a channel is detected. On the contrary, in the second embodiment, all broadcasting waves in all frequency bands are continuously detected, and a band code, a tuning voltage code and a channel number of each channel are stored in a memory device 11. In other words, the second embodiment is an example of the so-called automatic presetting apparatus.

Let us assume that the counters 10, 6 and 23 are reset in advance. At a presetting time, the presetting switch 17 is pushed to put the gate circuit in the on-state. Thus, the electronic tuner 1 can receive a channel having the lowest tuning frequency in the VHF low band. When the optimum tuning is obtained for the channel, one pulse is generated in the resonance judging circuit 14. The pulse from the circuit 14 is sent to the counter 23, and the count of the counter 23 is made 1. The count is used to specify an address of the memory device 11. That is, the address 1 of the memory device 11 stores therein the band code, the tuning voltage code, and the channel number of the received channel. In similar manners, all the channels up to the highest one in the UHF band are stored in addresses 2, 3, . . ., and so on of the memory device 11 each time an optimum tuning is successively obtained. When the highest channel in the UHF band is stored, the circuit 24 for judging the termination of the presetting operation is operated to stop the presetting operation. Thus, the presetting process terminates.

The reception of a desired channel is made in the same manner as in the first embodiment shown in FIG. 1. When, as an example, the first button of the channel selection switch 13 is selected, the address 1 of the memory device 11 is specified by the encoder 12, and the band code, the tuning voltage code and the channel number are read out. Thus, the channel which has been first stored in the course of the presetting operation, can be selected.

FIG. 8 is a block diagram showing a third embodiment of the channel indicator according to the present invention. In this embodiment, the presetting operation is conducted manually while observing a video image on a Braun tube of a TV receiver. In FIG. 8, like parts are given the same reference numerals as in FIG. 1, reference numerals 25 and 26 denote a tuning voltage up button and a tuning voltage down button, respectively, and reference numerals 6' and 10' denote up/down counters. Referring to FIG. 8, the first button of the channel selecting switch 13 is selected, and then the tuning voltage up button 25 is pushed. Since the counters 6' and 10' are reset in advance, the tuning voltage is increased from 0V. At this time, the electronic tuner 1 is put in the state that the VHF low band is received. With the rise of the tuning voltage, a channel, for instance, third channel which is desired to receive, is received, a video image of the channel appears on the Braun tube, and it is indicated by the channel number indicator 7 that the received channel is the third channel. After that, the tuning voltage down button 26 is also used, to employ the counter 10' as a down counter and to lower the tuning voltage. By appropriately employing the buttons 25 and 26, various optimum tunings are obtainable. If the buttons are released each time, an optimum tuning is obtained, and a band code, a tuning voltage code, and a channel number at that time are stored in the memory device 11. The operation of the counter 6' is as follows. The up/down counter 6' conducts the up count and is operated at the rising time of a pulse sent out of the $\frac{1}{3}$ frequency divider 5, during a period when the up button 25 is pushed. While, during a period when the down button 26 is pushed, the counter 6' conducts the down count and is operated at the falling time of a pulse from the $\frac{1}{3}$ frequency divider 5. FIG. 9 shows that a specified channel is indicated for the pulse duration of an output pulse from the $\frac{1}{3}$ frequency divider 5, no matter whether the tuning voltage is rising or falling. As described above, according to the third embodiment, any channel can be preset by a given button of the channel selecting switch 13. The reception of a desired channel is performed in the same manner as in the first and second embodiments.

Next, the method of indicating channel numbers is explained below in detail. In the abovementioned embodiments, the channel numbers may be indicated in such a manner that the channel numbers are stored in the memory device 11 in the form of 2-digit BCD code, two 7-segment light emitting diodes are provided which correspond to the tens and unit digits of the code, respectively, and appropriate segments of the diodes are energized whenever a button of the channel selecting switch 13 is selected. In this method, since only a single channel number indicator is employed, it is not clear what channel has been preset by a button of the channel selecting switch. FIG. 10 shows a circuit arrangement which can overcome the above problem. In FIG. 10, there is shown only a channel number indicating portion of a preset channel selection apparatus according to the present invention, and like parts are given the same reference numerals as in FIG. 7. Further, reference numeral 7' denotes a channel indicator corresponding to the first button of the channel selecting switch, 7" a channel indicator corresponding to the last button, and 27 a memory device. The memory device 27 is addressed by the counter 23 which counts the pulse from the resonance judging circuit 14, stores various counts (or channel numbers) of the counter 6, and delivers the counts to the indicators 7' to 7" in parallel. In this case, the memory device 11 does not store the channel number, but stores only the band code and the tuning voltage code. Whenever a channel is received with such a presetting operation as described above, the resonance judging circuit 14 delivers one pulse which is counted by the counter 23. The count of the counter 23 specifies an address of the memory device 27. In the embodiments shown in FIGS. 1, 7 and 8, the count of the counter 6, that is, the channel number is successively stored in the specified address each time each channel is received. The stored channel numbers are immediately delivered to the channel indicators 7' to 7" in parallel. In other words, a channel number preset by the first button is indicated by the indicator 7', a channel number by the second button is indicated by the next indicator, and a channel number by the last button is indicated by the indicator 7". Accordingly, when the buttons or the channel selecting switch 13 is placed in the proximity of the channel indicators, it is clearly shown what channel has been preset by a button.

In the above explanation, the Japanese television channels have been employed as an example. Needless to say, the present invention is also applicable for foreign channels. Since, in U.S.A., the television channel has an irregular frequency-interval in the VHF low band, the frequency characteristics of the SAW element and the method of counting the channel number are additionally explained below.

In U.S.A., the local oscillation frequency of each channel is established as the following Table 1.

TABLE 1

| Band | Channel number | Local oscillation frequency | Band | Channel number | Local oscillation frequency | Band | Channel number | Local oscillation frequency |
| --- | --- | --- | --- | --- | --- | --- | --- | --- |
| VHF low band | 2 | 101 (MHz) | VHF high band | 7 | 221 (MHz) | UHF band | 14 | 517 |
|  | 3 | 107 |  | 8 | 227 |  | 15 | 523 |
|  | 4 | 123 |  | 9 | 233 |  | . | . |
|  | 5 | 113 |  | 10 | 239 |  | . | . |
|  | 6 | 129 |  | 11 | 245 |  |  |  |
|  |  |  |  | 12 | 251 |  | 82 | 925 |
|  |  |  |  | 13 | 257 |  | 83 | 931 |

As is apparent from Table 1, all channels in the VHF high band and UHF band are arranged at a frequency-interval of 6 MHz. In the VHF low band, however, there is a frequency-interval of 10 MHz between the fourth channel and the fifth channel. In spite of such an irregularity in frequency-interval, correct channel numbers can be obtained through the use of a circuit shown in FIG. 11. FIG. 11 is a block diagram of a channel counting circuit used in a channel indicator according to the present invention. Reference numerals 1, 2, 3, 4, 5 and 6 denote the same elements or circuits as in FIG. 1. Reference numeral 28 denotes a 10-pulse detecting circuit which delivers an output signal when ten input pulses are inputted, 29 a 12-pulse detecting circuit which delivers an output signal when twelve input pulses are inputted, 30 an RS flip flop, 31 an RS flip flop (hereinafter referred to as an RSFF), 32 an OR gate, 33 an inverter, 34 an AND gate. Now, the operation of the channel counting circuit will be explained below with reference to FIG. 12, which shows waveform charts for explaining the above operation. For the SAW element 2 shown in FIG. 11, the distance between the output electrodes 19 and 20 shown in FIG. 2 is so selected as to make the delay time $\tau$ equal to 0.5 $\mu$sec. In other words, the element 2 has such a comb-shaped filter characteristic that voltage peaks appear at intervals of 2 MHz, as shown in FIG. 12(a), that is, the output voltage of the SAW element 2 assumes a peak value at local oscillation frequencies of 2 N MHz (N is an integer). Further, the lowest limit of the pass band of the element 2 is made 106 MHz. That is, the output voltage assumes the peak values from 106 MHz. When the local oscillation frequency of the electronic tuner 1 is swept, pulses are generated in the waveform shaping circuit 4 and delivered therefrom at intervals of 2 MHz, as shown in FIG. 12(b). When the 10-pulse detecting circuit 28 has just received ten pulses from the waveform shaping circuit 4, it generates an output to reset the RSFF 30. Accordingly, the Q output of the RSFF 30 assumes such a waveform as shown in FIG. 12(c). Similarly, when the 12-pulse detecting circuit 29 has just received twelve pulses from the waveform shaping circuit 4, it delivers an output to reset the RSFF 31. The Q output of the RSFF 31 takes a waveform as shown in FIG. 12(d). The signal from the Q outputs of the RSFF's 30 and 31 are combined with each other by the OR gate 32 to deliver an output signal having such a waveform as shown in FIG. 12(e). At this time, such pulses from the waveform shaping circuit 4 as shown in FIG. 12(b) are also supplied to the inverter 33, and the inverter 33 delivers a pulse train having such a waveform as shown in FIG. 12(f). The pulse train from the inverter 33 and the output signal from the OR gate 32 are applied to the AND gate 34 to deliver therefrom a pulse signal having such a waveform as shown in FIG. 12(g). The pulse signal from the AND gate 34 is frequency-divided by the ⅓ frequency divider 5 to supply to the counter 6 such pulses as shown in FIG. 12(h). The counter 6 counts up the supplied pulses.

As can be understood from FIG. 12, when the local oscillation frequency of the electronic tuner 1 is increased in the VHF low band, the output from the SAW element 2 is frequency-divided by the ⅓ frequency divider 5 in the frequency range from the 2nd channel to the 4th channel, and the counter 6 counts up the output pulses from the ⅓ frequency divider 5 as they are. The output of the counter 6 can indicate the channel number, since the channels are established at intervals of 6 MHz in the above frequency range. While, since there is a frequency-difference of 10 MHz between the 4th channel and the 5th channel, the correct channel number is not obtained by the same processing as in the frequency range from the 2nd channel to the 4th channel. This problem can be solved by the circuit arrangement shown in FIG. 11. When the local oscillation frequency reaches that of the 4th channel, the 10-pulse detecting circuit 28 starts to operate to remove excess pulses from the waveform shaping circuit 4. After the excess pulses have been removed, the operation is restored to the original state by the 12-pulse detecting circuit 29. That is, a predetermined number of pulses (or excess pulses) are removed only for the frequency interval of 10 MHz to prevent the output of the counter 6 from differing from the channel number. Thus, channel numbers of channels having different frequency-intervals can be correctly indicated by means of a single SAW element 2.

In such a channel number counting circuit, it is required to employ an SAW element 2 having a substrate which is excellent in temperature characteristic of propagation velocity of surface acoustic wave, for the reasons described below. When the distance between the output electrodes 19 and 20 shown in FIG. 2 is given by D, and the propagation velocity of the surface acoustic wave is given by v, the delay time $\tau$ is given by the following equation:

$$\tau = D/v \tag{4}$$

That is, the peak frequency f is given by the folloing equation:

$$f = \frac{Nv}{D} \tag{5}$$

where N is an integer.

Thus, the peak frequency f is strongly affected by the temperature dependence of the propagation velocity. As a substrate material of the SAW element, $LiNbO_3$ is readily available, inexpensive, and low in input/output impedance. However, the $LiNbO_3$ has a temperature coefficient of $-90$ PPM/°C. Accordingly, when an SAW element operating at 824 MHz (the highest operating frequency in the UHF band) is subjected to a temperature change of 40° C., the peak frequency is deviated by an amount given by the following equation:

$$824 \times 90 \times 40 = 2.97 \text{ (MHz)} \tag{6}$$

Thus, there is a certain danger of a wrong channel number being indicated. However, an SAW element having a substrate which is inexpensive but is not so excellent in temperature characteristic, can indicate the correct channel number over a wide range of temperature in the following manner.

FIG. 13 shows a temperature compensating circuit used in a channel indicator according to the present invention. In FIG. 13, reference numeral 35 denotes a thermistor, 36 to 39 resistors, 40 a Zener diode, 41 a transistor, 42 a D flip flop, 43 a 2-bit counter, 44 to 46 AND circuits, 47 an inverter, and 48 an OR circuit. The same parts as in other figures are given the same reference numerals. Referring to FIG. 13, the resistance of the thermistor 35 is decreased at a high temperature, and a potential of a junction node A is made less than a Zener voltage of the Zener diode 40. Accordingly, the base current of the transistor 41 does not flow, and thus the transistor 41 is made non-conductive to put the D input of the flip flop in H (high) level. Conversely, the D input is put in L (low) level at a low temperature. The resistor 36, thermistor 35 and Zener diode 40 are so selected that the conductive and non-conductive states of the transistor 41 are changed over at a temperature of 25° C. An input signal on the D input terminal of the D flip flop 42 is sent to and delivered from the Q output terminal in synchronism with the operation of the channel selecting switch 13, in order to prevent the Q output being varied together with a change in the output of the transistor 41 during the channel selection. The 2-bit counter 43 behaves as a $\frac{1}{3}$ frequency divider for pulses from the waveform shaping circuit 4. That is, when Q1 and Q2 terminals respectively corresponding to the first and second bits are both put in the state of 1, the terminals are reset by the AND circuit 44 to perform the frequency-demultiplying operation. In this case, the frequency-demultiplied signal is outputted from the AND circuit 46 or the AND circuit 45 according as the thermistor 35 is kept at a high temperature or a low temperature.

The operation of the temperature compensating cirucit shown in FIG. 13 is explained below in more detail in conjunction with FIG. 14, which shows waveform charts of signals appearing on various terminals shown in FIG. 13. A pulse train such as shown in FIG. 14(a) is supplied from the waveform shaping circuit 4 to a C terminal of the 2-bit counter 43. When the C terminal receives three pulses, the Q1 and Q2 terminals are both put in the state of 1, and are immediately reset. Accordingly, the Q1 and Q2 terminals deliver output signals having such waveforms as shown in FIGS. 14(b) and 14(c), respectively. At a high temperature, since the Q output is put in H level and the $\overline{Q}$ output is put in L level, the output of the AND circuit 46 is the same as the output from the Q2 terminal, and thus the frequency-demultiplying operation starts from the second one of the pulses sent out of the waveform shaping circuit 4. On the other hand, at a low temperature, since the $\overline{Q}$ output is put in H level and the Q output is put in L level, the output of the AND circuit 45 is equal to the logical product of the Q1 output and a $\overline{Q2}$ output such as shown in FIG. 14(d). Thus, the frequency-demultiplying operation starts from the first one of the pulses sent out of the waveform shaping circuit 4, as shown in FIG. 14(e).

The relation between the above operation and the SAW element is explained below. FIG. 15 shows the comb-shaped filter characteristics of the SAW element and the output of the waveform shaping circuit 4 to clarify the above-mentioned relation. Let us assume that, at a temperature of 25° C., the 3rd, 6th and 9th peaks coincide with the Nth, (N+1)th and (N+2)th channels, as shown in FIG. 15(b). Since the SAW element 2 has a negative temperature characteristic, the comb-shaped filter characteristic is deviated, for example, as shown in FIG. 15(a) and in FIG. 15(c) at temperatures higher than 25° C. and at temperatures lower than 25° C., respectively. Accordingly, in the case that the frequency-demultiplying operation starts from the first peak in the entire range of temperature, the Nth channel is erroneously indicated as the (N+1)th channel at a high temperature. On the other hand, in the case that the frequency-demultiplying operation starts from the second peak, only a little margin is left in the range in which the Nth channel is correctly indicated, at a low temperature, and the wrong indication is made when the temperature is more decreased.

In the present invention, the frequency-demultiplying operation starts from the first peak at a low temperature and starts from the second peak at a high temperature. That is, the peak from which the frequency-demultiplying operation starts, is changed over depending on the temperature. Thus, such ranges of indication as shown by arrows in FIGS. 15A and 15C are given, and the margin is increased. Further, at a temperature of 25° C., it is not certain due to the non-uniformity of circuit elements whether the frequency-demultiplying operation starts from the first peak or from the second peak. However, in either case, the correct indication can be made with a sufficient margin. In conclusion, according to the above-mentioned operation of the present invention, even when an SAW element having a substrate which is not particularly good in temperature characteristic is employed, the channel number can be correctly indicated without any maloperation over a wide range of temperature.

As described hereinbefore, according to the present invention, there can be provided a channel indicator which overcomes the drawback with known channel selection apparatus employing a D-A converter, that is, the problem that the channel number of a received channel cannot be known without checking a broadcasting program table. Moreover, in the present invention, the channel number can be automatically indicated by employing an SAW element. Accordingly, the presetting operation of channel numbers (manually conducted in usual) which is required when only a storage for channel number is employed, can be completely omitted. Further, the present invention is applicable for the case that the frequency-interval between adjacent channels is varied, and moreover can employ an SAW element which is not so good in temperature characteristic.

What is claimed is:

1. A channel indicator comprising:
   a voltage-controlled type electric tuner having sweeping means for generating a sweep voltage and a voltage-controlled type local oscillator for generating a sweeping local oscillation signal the frequency of which is varied in accordance with the sweep voltage supplied from said sweep means;
   a comb-shaped surface acoustic wave filter coupled to the local oscillation signal, said filter having a multi-pass-band characteristic, the center frequencies of which pass-bands have predetermined frequency intervals therebetween, wherein said filter generates an output signal having peak values each of which corresponds to the passing of the local oscillation signal through each pass-band of said multi-band-pass characteristic of said comb-shaped surface acoustic wave filter;
   means for amplitude-detecting the output of said comb-shaped surface acoustic wave filter and producing an output having peaks corresponding to the peak values of said filter output signal;
   a counter for counting the number of peaks in the output of said amplitude-detecting means to determine the number of pass-bands of the filter which the local oscillation signal has swept through; and
   a channel number indicator for indicating a channel number in a predetermined relation corresponding to the counted result of said counter.

2. A channel indicator comprising:

a voltage-controlled type electric tuner having sweeping means for generating a sweep voltage and a voltage-controlled type local oscillator for generating a sweeping local oscillation signal the frequency of which is varied in accordance with the sweep voltage supplied from said sweep means;

a comb-shaped surface acoustic wave filter coupled to the local oscillation signal, said filter having a multi-pass-band characteristic, the center frequencies of which pass-bands have a predetermined frequency interval therebetween, wherein said filter generates an output signal having peak values each of which corresponds to the passing of the local oscillation signal through each pass-band of said multi-band-pass characteristic of said comb-shaped surface acoustic wave filter;

means for amplitude-detecting the output of said comb-shaped surface acoustic wave filter and producing an output having peaks corresponding to the peak values of said filter output signal;

a frequency divider for reducing the output frequency of said amplitude-detecting means;

a counter for counting the number of peaks in the output of said frequency divider; and a channel number indicator for indicating a channel number in a predetermined relation corresponding to the counted result of said counter.

3. A channel indicator according to claim 2 further comprising a pulse generating circuit for generating a specified number of pulses when said number of outputs sent out of said detecting means reaches a specified value, and means for adding an output of said pulse generating circuit and said number of outputs sent out of said detecting means to judge a channel number.

4. A channel indicator according to claims 1 or 2, further comprising means for subtracting a predetermied number of outputs of said detecting means from the number of subsequent outputs of said detecting means when the number of outputs sent out of said detector reaches a specified value, in order to judge a channel number.

5. A channel indicator according to claims 1 or 2, further comprising means for judging an ambient temperature to changeover a starting point for counting up said number of outputs sent out of said amplitude-detecting means.

6. A channel indicator according to claim 5, wherein a substrate of said comb-shaped surface acoustic wave filter has a negative temperature characteristic, and wherein a starting point for counting up said number of outputs sent out of said detector is so changed over that the counting of said outputs starts from a first output at a low ambient temperature and said counting starts from a predetermined number of outputs after said first output at a high ambient temperature.

7. A channel indicator according to claim 1, further comprising a waveform shaping circuit for shaping the waveform of the output of said amplitude-detecting means.

8. A channel indicator according to claim 1, wherein said counter comprises an up/down counter.

9. A channel indicator according to claim 2, wherein the predetermined frequency interval between the center frequencies of the pass-bands of the filter is 2MHz, and further wherein the frequency divider is a $\frac{1}{3}$ frequency divider.

10. A channel indicator comprising:

a voltage-controlled type electric tuner having sweeping means for generating a sweep voltage and a voltage-controlled type local oscillator for generating a sweeping local oscillation signal the frequency of which is varied in accordance with the sweep voltage supplied from said sweep means;

a comb-shaped surface acoustic wave filter coupled to the local oscillation signal, said filter having a multi-pass-band characteristic, the center frequencies of which pass-bands have a predetermined frequency interval therebetween, wherein said filter generates an output signal having peak values each of which corresponds to the passing of the local oscillation signal through each pass-band of said multi-band-pass characteristic of said comb-shaped surface acoustic wave filter;

means for amplitude-detecting the output of said comb-shaped surface acoustic wave filter and producing an output having peaks corresponding to the peak values of said filter output signal;

a frequency divider for reducing the output frequency of said amplitude-detecting means, to provide an output signal having peaks spaced apart from one another by frequency intervals corresponding to frequency intervals broadcast channels to be received;

a counter for counting the number of peaks in the output of said frequency divider; and a channel number indicator for indicating a channel number in a predetermined relation corresponding to the counted result of said counter.

11. A channel indicator according to claim 10, wherein the predetermined frequency interval for the filter center frequencies is 2 MHz and the frequency divider is a $\frac{1}{3}$ frequency divider so that the frequency intervals for the frequency divider output corresponding to the received broadcast channels signal are 6 MHz.

12. A channel indicator according to claim 10 or 11, further comprising means for changing the frequency interval of the frequency divider output signal for predetermined received broadcast channels.

13. A channel indicator according to claim 12, wherein the means for changing the frequency interval comprises means for reducing the frequency interval for predetermined received broadcast channels.

14. A channel indicator according to claim 12, wherein the means for changing the frequency interval comprises means for increasing the frequency interval for predetermined received broadcast channels.

* * * * *